United States Patent [19]

Asamaki et al.

[11] Patent Number: 4,638,209
[45] Date of Patent: Jan. 20, 1987

[54] ION BEAM GENERATING APPARATUS

[75] Inventors: Tatsuo Asamaki; Takao Kato, both of Tokyo, Japan

[73] Assignee: Anelva Corporation, Japan

[21] Appl. No.: 646,438

[22] Filed: Sep. 4, 1984

[30] Foreign Application Priority Data

Sep. 8, 1983 [JP] Japan ............................. 58-165628

[51] Int. Cl.[4] ............................................. H05H 29/00
[52] U.S. Cl. ................................. 313/359.1; 313/362.1
[58] Field of Search ............... 313/359.1, 362.1, 363.1, 313/22; 250/423 F, 424, 425, 426, 427; 315/111.81, 111.91

[56] References Cited

U.S. PATENT DOCUMENTS

| | | | |
|---|---|---|---|
| 2,809,314 | 10/1957 | Herb | 250/423 F |
| 3,046,429 | 7/1962 | Beurtheret | 313/22 |
| 3,369,148 | 2/1968 | Hitchcock | 250/423 F |
| 3,409,529 | 11/1968 | Chopra et al. | 250/426 |
| 3,860,848 | 1/1975 | Knof et al. | 250/427 |
| 3,911,311 | 10/1975 | Heil | 313/362.1 |
| 4,488,045 | 12/1984 | Anazawa et al. | 313/362.1 |

FOREIGN PATENT DOCUMENTS

| | | | |
|---|---|---|---|
| 0158844 | 9/1983 | Japan | 250/427 |
| 0198824 | 11/1983 | Japan | 315/111.81 |
| 0031542 | 2/1984 | Japan | 250/425 |

OTHER PUBLICATIONS

Methodicum Chimicum, vol., Part A "Analytical Methods Purification, Wet Processes Determination of Structure", Friedhelm Korte.
Nuclear Instruments and Methods, 1981, "Advances in Molten Metal Field Ion Sources", R. Clampitt.
"$H_2$ and Rare Gas Field Ion Source with High Angular Current,"—Gary R. Hanson et al., J. Vac. Sci. Technol., 1979.
"Gas Ion Sources for Micropatterning", Takashi Horiuchi et al. Japan Society For Promotion of Science, 1982.
"Liquid Metal Source of Gold Ions", P. D. Prewett et al., Rev. Sci. Instrum., 1981, Am. Inst. Physics.

Primary Examiner—David K. Moore
Attorney, Agent, or Firm—Remy J. VanOphem

[57] ABSTRACT

An ion beam generating apparatus is used together with a vacuum chamber. The ion beam generating apparatus has an anode assembly arranged inside the vacuum chamber, a 5 gas supply mechanism for supplying a gas into the vicinity of the anode assembly, a temperature control mechanism for controlling a temperature of an apex of the anode assembly, and a cooling mechanism for cooling at least part of the anode assembly.

21 Claims, 7 Drawing Figures

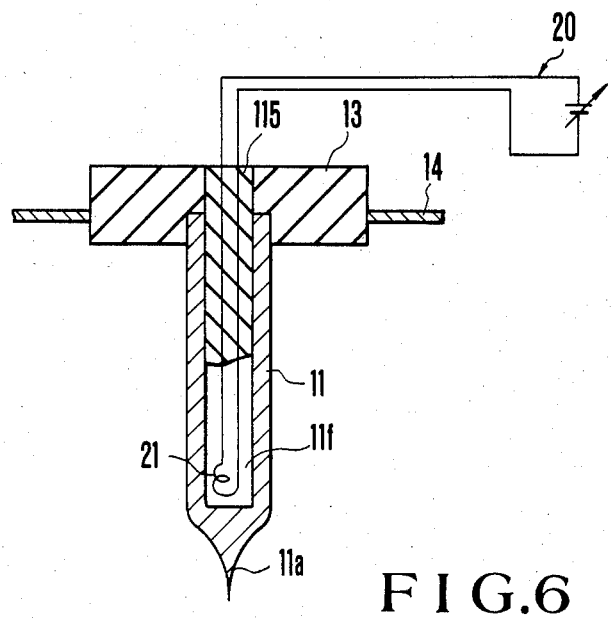
F I G. 6
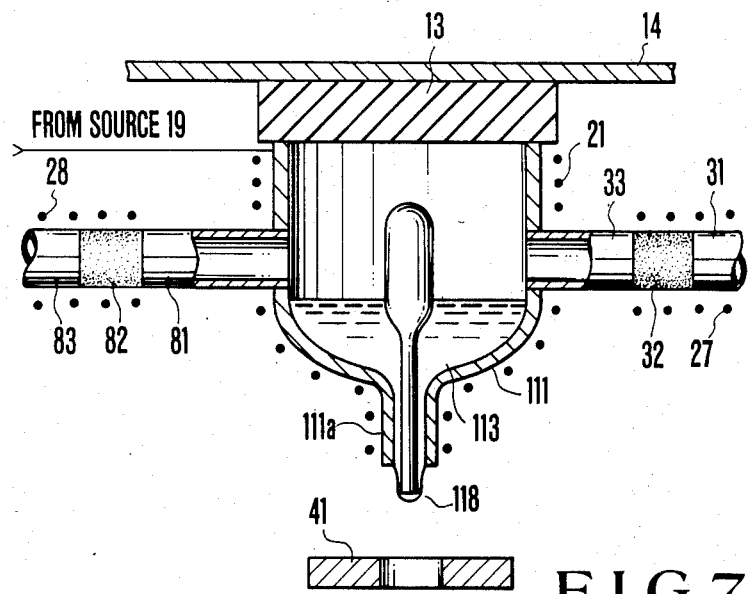
F I G. 7

ION BEAM GENERATING APPARATUS

BACKGROUND OF THE INVENTION

The present invention relates to an ion beam generating apparatus.

Along with recent advances in electronics, various new techniques have been developed. A typical example is an ion beam generating apparatus. Since such an ion beam generating apparatus can provide a very small beam spot, it has been receiving a great deal of attention in the field of microelectronics, especially in relation to semiconductor fabrication techniques. In semiconductor fabrication techniques, various types of conventional micropatterning techniques have been proposed. Micropatterning to an accuracy of up to one micron is the current limit in photolithography. The electron beam is no exception. Since the mass of the electron beam is smaller than that of atoms, electron beams are greatly scattered in a semiconductor material in addition to the influence of a proximity effect. On the other hand, an ion beam has a larger mass and so is scattered much less in a material. In other words, an ion beam is free from the proximity effect, thereby allowing a good micropattern to be obtained.

Conventional ion beam generating apparatuses developed so far have a field emission liquid metal ion source. This source is also called an electrohydrodynamic (EHD) ion source. When a needle is wetted with a liquid metal in a high electric field, ions are emitted from the apex of the needle in accordance with a field ionization effect. For example, an ion beam generating apparatus of this type is described by R. Clampitt in "Advances in Molten Metal Field Ion Sources", 1981 Nuclear Instrument and Methods 189 (1981) 111–116, North-Holland Publishing Company. In this case, the metal is heated at a temperature above its melting point since it must be molten. It is very difficult to continuously supply a molten metal to the needle for a long period of time. Various complicated countermeasures must be taken for high temperature treatments.

The present inventor noticed a new technique wherein a gas is supplied to extract, as an ion beam, an element contained in the gas. This technique is reported in the following reference: "H$_2$ and rare gas field ion source with high angular current", Gary R. Hanson and Benjamin M. Siegel, J. Vac. Sci. Technol., 16(6), Nov./Dec. 1979, ©1980 American Vacuum Society. In this reference, liquid helium is used as a coolant, and hydrogen gas is used as a source gas.

Another reference is "Gas Ion Sources for Micropatterning", Takashi Horiuchi et al, the Japan Society for the Promotion of Science, 132nd Committee, 81st Study Meeting, Sept. 24, 1982, P. 21. In this reference, liquid nitrogen is used as a coolant, and hydrogen gas is used as a source gas.

Since helium and nitrogen, which are liquid in only a narrow temperature range, are used as the coolants, the type of ion able to be selected is limited. In addition, each source gas has an optimal application temperature at which it is preferably set. However, this is not noticed in the conventional apparatuses.

SUMMARY OF THE INVENTION

It is, therefore, a principal object of the present invention to provide an ion beam generating apparatus wherein the temperature of an electrode assembly can be easily and properly achieved to provide high reliability.

It is another object of the present invention to provide an ion beam generating apparatus capable of continuously emitting ion beams for a long period of time.

It is still another object of the present invention to provide an ion beam generating apparatus capable of simply changing the type of ion.

It is still another object of the present invention to provide an ion beam generating apparatus capable of emitting a higher bright ion beam.

It is still another object of the present invention to provide an ion beam generating apparatus for emitting various types of ions at a less extreme low temperature than a conventional apparatus.

In order to achieve the above objects of the present invention, there is provided an ion beam generating apparatus having a vacuum chamber which is evacuated at a predetermined pressure, an anode assembly disposed in the vacuum chamber and having a sharp needle anode, a power source device for ionizing a material present on a surface of the anode assembly and extracting the material as ions, and electrode mechanisms, having gas supplying means for supplying a predetermined gas to a vicinity of the anode assembly, heating means for maintaining the needle anode of the anode assembly at a predetermined temperature, and cooling means for cooling at least part of the anode assembly.

BRIEF DESCRIPTION OF THE DRAWINGS

FIGS. 3 to 7 are partial sectional views showing ion beam generating apparatuses according to other embodiments of the present invention.

DESCRIPTION OF THE PREFERRED EMBODIMENTS

Figure 1:
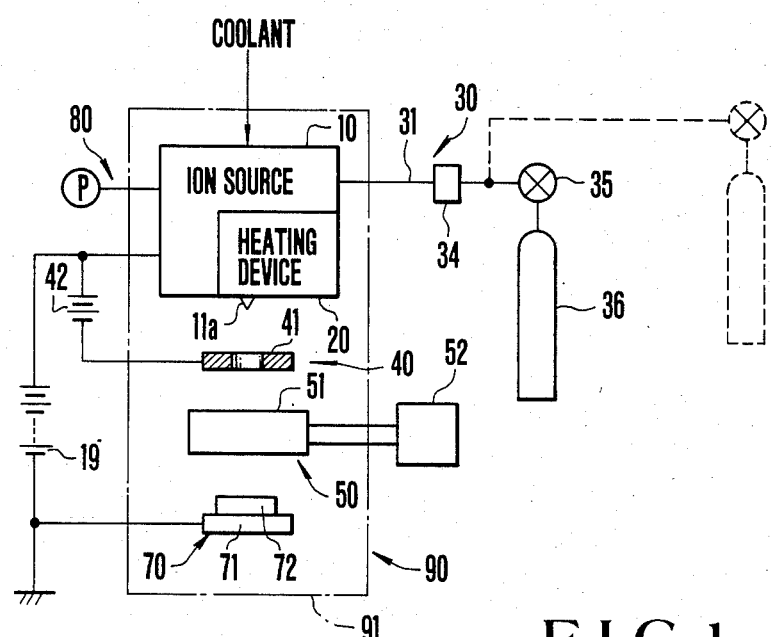
FIG. 1 is a block diagram showing the basic configuration of an ion beam generating apparatus according to the present invention.
Figure 2:
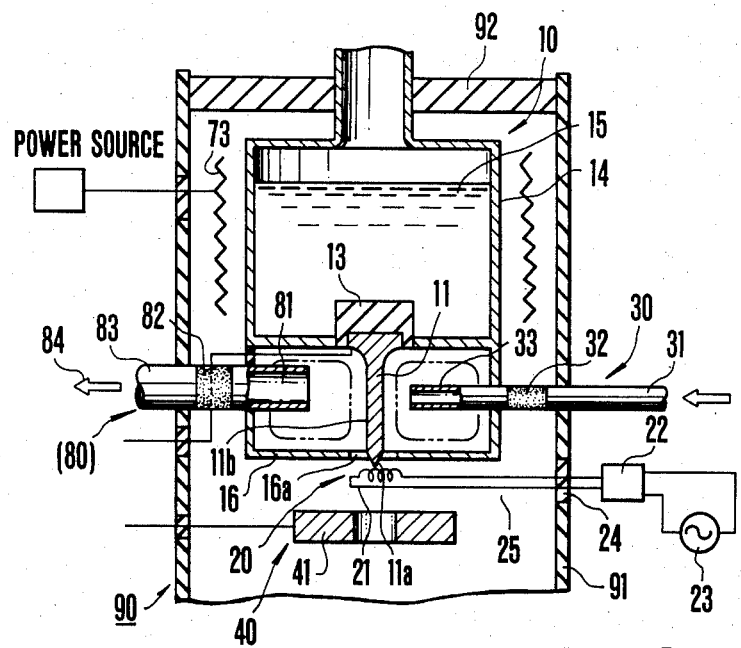
FIG. 2 is a partial sectional view showing the detailed configuration of the part near an ion source.

FIGS. 1 and 2 show an ion beam generating apparatus according to an embodiment of the present invention. This ion beam generating apparatus basically includes an ion source 10, a heating device 20 for a needle anode of the ion source 10, a gas supply electrode or device 30 for the ion source 10, an ion extraction electrode 40 for extracting ions obtained from the apex of the needle anode in accordance with the field ionization effect, an ion beam control device 50 for performing various types of processing of the extracted ion beams, a cathode device 70 including a workpiece table, a gas evacuation device 80 for evacuating the gas from the ion source 10, and a vacuum chamber 90 including all or some of the above-mentioned components.

The ion source 10 has an ion generation function for extracting ions from a source gas. The ion source 10 includes an anode assembly 11 having a needle anode 11a, a support member 13 for supporting the anode assembly 11, a coolant reservoir 14 having the support member 13 as part of a bottom thereof to store a coolant 15 for cooling the anode assembly 11, and an ionization chamber 16 formed integrally with the coolant reservoir 14 to surround most part of the anode assembly 11 extending downward from the bottom of the coolant reservoir 14. In this case, the coolant reservoir 14 is connected to a known coolant mechanism (not shown)

for supplying and replenishing the coolant 15 to the coolant reservoir 14. The coolant reservoir 14 is made of a material (e.g., stainless steel) having a low thermal conductivity at extremely low temperatures. The coolant 15 comprises is a known material, such as liquid helium or liquid nitrogen. The support member 13 which supports the anode assembly 11 and which constitutes part of the bottom of the coolant reservoir 14 comprises is a thermally conductive and electrically insulating material, such as sapphire or ruby, so as to effectively conduct heat from the coolant 15. The anode assembly 11 is embedded to achieve good thermal conduction or fixed by a proper technique in the support member 13. The anode assembly 11 is made of copper and has a rod-like shape. The apex of the anode assembly 11 constitutes the needle anode 11a.

The ionization chamber 16 serves to produce a gaseous atmosphere around the anode assembly 11. The ionization chamber 16 has an L-shaped section and is made of copper. The ionization chamber 16 is fixed with screws or is brazed on the coolant reservoir 14 and defines a gas space therein. A hole 16a is formed at the center of the bottom of the ionization chamber 16. In this embodiment, the apex of the anode assembly 11 is located substantially at the center of the hole 16a and slightly extends downward through the hole 16a.

The anode assembly 11 is applied with an acceleration voltage from an acceleration power source 19 shown in FIG. 1. This acceleration voltage varies in accordance with the type of ion beam to be emitted and an application purpose. One terminal of the acceleration power source 19 is grounded, and the other terminal thereof is connected to the anode assembly 11 in the ionization chamber 16 by means of an insulated lead extending through a case 91 of the vacuum chamber 90 and the ionization chamber 16.

The case 91 is a stainless steel cylinder which is closed by an insulator 92 of, for example, ceramic, Teflon or steadite. A pipe for connecting the coolant reservoir 14 in the ion source 10 to the coolant mechanism (not shown) extends through the insulator plate 92. The vacuum chamber 90 is evacuated by a known method (e.g., by using a vacuum pump) to a predetermined vacuum pressure. The operation of the vacuum chamber 90 is known to those skilled in the art, and a detailed description thereof will be omitted.

A coil heater 21 of the heating device 20 surrounds the needle anode 11a at a predetermined distance therefrom. The heating device 20 controls a temperature in the vicinity of the needle anode 11a to obtain an optimal temperature for ionization. The heating device 20 includes the coil heater 21, a temperature adjusting mechanism 22 arranged outside the case 91 of the vacuum chamber 90, a power source 23 for the temperature adjusting mechanism 22, and a lead 25 for connecting the temperature adjusting mechanism 22 and the coil heater 21. In this embodiment, the power source 23 is an AC power source. However, a DC power source may also be used as the power source 23.

When the coil heater 21 may disturb an electric field in the vicinity of the needle anode 11a, the coil heater 21 may be located instead around a central portion 11b of the anode assembly 11 apart from the needle anode 11a. A potential at the coil heater 21 may be set at a proper potential, such as the ground potential, as needed.

The gas supply device 30 for supplying a gas to the ionization chamber 16 includes a gas supply pipe 31, a thermal and electrical insulator 32, a gas inlet pipe 33, a flow control mechanism 34, a regulation valve 35 and a pressurized gas cylinder or tank 36 filled with a predetermined gas. One end (i.e., a distal end) of the gas inlet pipe 33 is led inside the ionization chamber 16, and the other end thereof is connected to one end of the gas supply pipe 31 through the insulator 32 made of Teflon or ceramic. The flow control mechanism 34 is connected through the case 91 of the vacuum chamber 90 to the gas supply pipe 31 located outside the vacuum chamber 90. The flow control mechanism 34 controls a flow rate of the gas supplied from the gas tank 36 through the regulation valve 35.

The ion extraction electrode 40 includes an extraction electrode 41 and an extraction power source 42 connected to the electrode 41. The positive terminal of the extraction power source 42 is connected to the positive terminal of the acceleration power source 19, and the negative terminal of the extraction power source 42 is connected to the extraction electrode 41. Therefore, a negative voltage with respect to the needle anode 11a is applied to the extraction electrode 41. The extraction electrode 41 includes a disk having an opening at its center.

The ion beam control device 50 is arranged below the ion extraction electrode 40 to control ion beams extracted from part of the needle anode 11a. The ion beam control device 50 may includes a lens system for focusing the ion beam, a deflection system for deflecting the ion beam, and/or a system using one or both the electric and magnetic fields for separating impurities. Reference numeral 51 in FIG. 1 denotes a device including a group of various types of electrodes used in these systems; and 52, a power source for supplying power to these electrodes.

The cathode device 70 is arranged to oppose the anode assembly 11, especially the needle anode 11a. The cathode device 70 has a cathode 71 on which a substrate 72 is placed. In this embodiment, the cathode 71 is grounded.

The gas evacuation device 80 includes gas evacuating means for evacuating excessive gas supplied by the gas supply device 30 in the internal space of the ionization chamber 16. The gas evacuating means is arranged so that the gas pressure at the apex of the needle is high. The gas evacuation device 80 includes an evacuation pipe 81, a thermal and electrical insulator 82 and an evacuation port 83. One end of the evacuation pipe 81 extends through the ionization chamber 16 and is located inside the space of the ionization chamber 16. The other end of the evacuation pipe 81 is connected to a pump P (FIG. 1) through the insulator 82 and the evacuation port 83. However, when the needle anode is insulated by sapphire or the like, the insulators 32 and 82 need not have an electric insulation property. In this case, the insulator 92 as the upper plate of the case may be replaced with a metal member.

This apparatus is operated substantially in the following manner. The vacuum chamber 90 is evacuated to a pressure below a predetermined pressure (e.g., $10^{-4}$ Pa), and liquid nitrogen is supplied as the coolant 15 to the coolant reservoir 14. Thereafter, diborane having the boiling point of $-92.8°$ C. and the melting point of $-164.9°$ C. and phosphine having the boiling point of $-87.7°$ C. and the melting point of $-133.8°$ C. or the like from the gas tank 36 is supplied as the predetermined gas to the ionization chamber 16 through the gas inlet pipe 33. Diborane is condensed on the surface of the anode assembly 11 cooled by the coolant 15 and heated by the coil heater 21 at a predetermined temperature, so that the anode assembly 11 is wetted with diborane. When the extraction power source 42 and the acceleration power source 19 are operated, boron ions are extracted from the needle anode 11a.

The ion beam is focused, deflected or subjected to impurity separation, as needed through the device 51. The ion beam through the device 51 irradiates the substrate 72 on the cathode 71. For example, when the substrate 72 is a silicon wafer, boron ions can be doped in the substrate uniformly or in a predetermined pattern. When another type of ion is used, exposure of photoresist material or etching can be performed. A temperature of the anode assembly greatly varies in accordance with a combination of a material of the anode assembly and a liquid applied to the surface thereof. However, when a viscosity of a liquid at its boiling point does not substantially vary from that at its melting point, a temperature near the boiling point is preferably set. However, a temperature near the melting point may be used in consideration of vapor pressure. However, when a viscosity of a liquid at its boiling point greatly changes from that at its melting point, a temperature wherein the viscosity difference is smallest is preferably selected. The material of the anode assembly is selected in combination with the gas used. The anode assembly may include a porous material. Alternatively, the surface of the anode assembly may include a stepped surface or may be partially or entirely provided with a material which shows a high conformability with the gas.

According to the present invention as described above, a predetermined gas is supplied to the vicinity of the needle anode 11a. This gas is added to the coolant and is kept at an optimal temperature by means of the heating means located in the vicinity of the needle anode. Therefore, the ion beams can be extracted more stably than in the conventional apparatus.

Unlike the conventional apparatus wherein the needle anode is cooled to extract boron ions, the needle anode 11a may be cooled to a less extreme temperature around $-100°$ C. since a metal source gas is used, thereby preventing the conventional drawback (i.e., the needle reacts with strongly reactive boron and is damaged) and hence resulting in long service life. This temperature is not as low as the temperature falling within the range of 10° to 20° Kelvin which is used to extract hydrogen ions. In this manner, the ions can be extracted at a less extreme temperature than in a conventional apparatus. More particularly, a source gas of a hydrogenated material, halide or carbonate of a metal, semiconductor or hydrogen, which is to be ionized, can be liquefied at a less extreme temperature than the hydrogenated material, halide or carbonate itself. This is one of the most important points in the present invention. In the apparatus of the present invention, any material can be ionized at a less extreme temperature than in a conventional apparatus.

The ion beam generating apparatus according to the present invention can perform continuous operation until the gas tank 36 becomes empty. Therefore, continuous operation, which is the most important factor in fabrication of semiconductor elements, can be performed without difficulty. When an empty gas tank is replaced with a full one, and when a plurality of gas tanks are used and selectively switched, various types of ions can be easily generated. Gas tank switching must be performed after the coolant has been sufficiently heated by a heater 73 to completely remove the previous gas. Therefore, a high-purity ion beam can be constantly generated. In addition to this advantage, gas tank switching can be performed at high speed.

Figure 3:
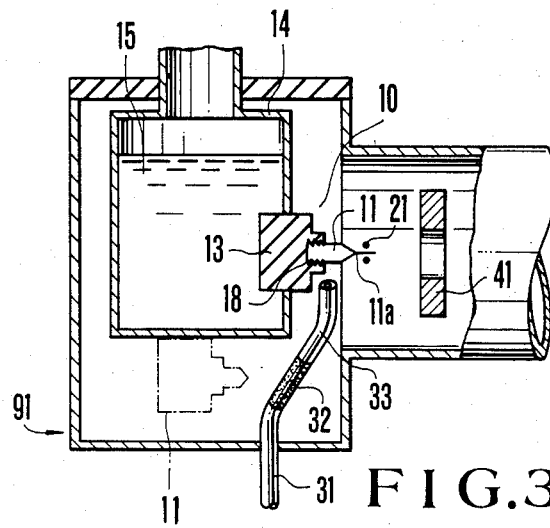

FIG. 3 shows another embodiment of the present invention. According to this embodiment, ion beams are horizontally extracted. The same reference numerals in FIG. 3 denote the same parts as in FIGS. 1 and 2, and a detailed description thereof will be omitted. As is apparent from FIG. 3, an evacuation system for a vacuum chamber 90 and an evacuation system for evacuating a gas along a direction indicated by an arrow 84 (FIG. 2) are commonly used. In addition, an anode assembly 11 can be screwed. All other components and operations of this embodiment can be understood in the same manner as those of the embodiment shown in FIG. 1. In this case, the anode assembly may be suspended from the bottom of the reservoir 14, as indicated by the alternate long and short dashed line in FIG. 3. The anode assembly is directed to the right or left (right in FIG. 3).

Figure 4:
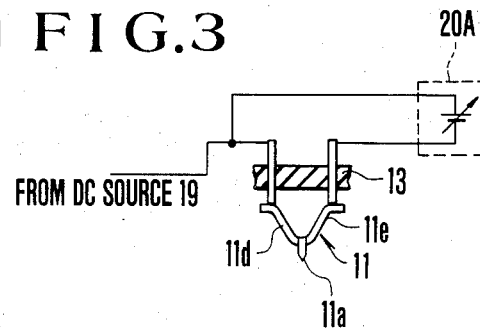

FIG. 4 shows still another embodiment of the present invention, particularly showing an anode assembly 11 in an enlarged manner. In each of the previous embodiments, the needle anode 11a is attached at the apex of the rod-like anode assembly 11. However, in this embodiment, a needle anode 11a is supported by two conductive leads 11d and 11e embedded in a support member. The lead 11d is connected to a DC acceleration power source 19. A series circuit of the lead 11d, the needle anode 11a and the lead 11e is directly connected to a heating power source 20A. The heating power source 20A may be a DC or AC power source. The heating power source 20A supplies a variable current to the leads 11d and 11e and the needle anode 11a, or only the needle anode 11a which is then heated. A temperature in the vicinity of the leads 11d and 11e and the needle anode 11a, or only of the needle anode 11a, can be maintained at an optimal temperature. According to this embodiment, the layout in the vicinity of the needle anode 11a can be simplified.

Figure 5:
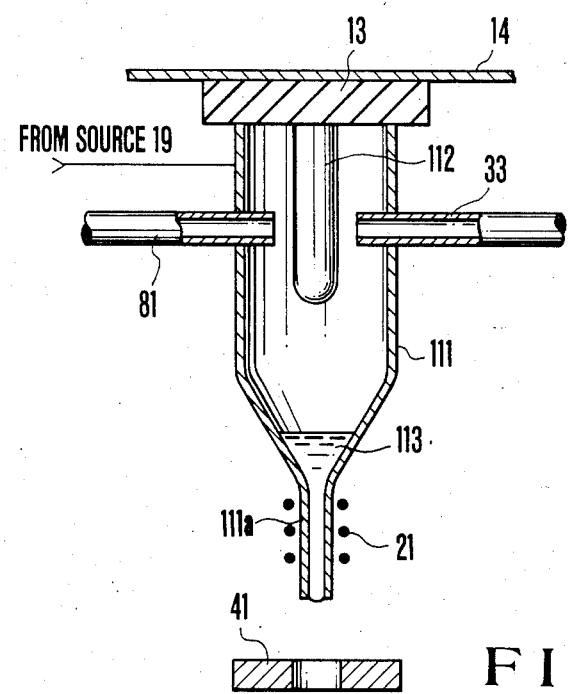

FIG. 5 shows still another embodiment of the present invention. In this embodiment, a thermally conductive and electrically insulating support member 13 is fixed at the outer surface of the bottom of a coolant reservoir 14. A copper anode assembly 111 extends downward from the support member 13. The anode assembly 111 has a funnel-like or cylindrical shape as a whole and is tapered downward. A condensation rod 112 extends downward from the support member 13. A gas is supplied from a gas tank to the condensation rod 112 through a gas inlet pipe 33 and is sprayed on the condensation rod 112 to condense the gas. A condensed liquid 113 is dripped downward and stored in a capillary portion or needle anode 111a. When excessive gas is present inside the anode assembly 111, it can be evacuated through an evacuation pipe 81 in the same manner as in the previous embodiments. An acceleration voltage is applied by a proper means from the power source 19 to the anode assembly 111. A coil heater 21 of the heating device 20 surrounds a capillary, the needle anode. The anode assembly 111 may comprise be a metal (e.g., tungsten, tantalum or stainless steel), or a transition metal carbide, nitride or boride, in place of copper. In this case, the main body of the anode assembly is brazed or fixed by a known method.

According to the arrangement described above, since the gas to be ionized can be condensed inside the needle anode, the utilization efficiency of the gas is improved, and the gas will not contaminate any other component. As described above, the heating means is disposed in the vicinity of the condensation rod 112. However, a heating means may be embedded inside the condensation rod 112 shown in FIG. 5 in the same manner as in an anode assembly embedded with the heating means to be illustrated in FIG. 6. In this embodiment, in order to extract the ions in the horizontal direction, the needle anode 111a may be bent in the horizontal direction.

FIG. 6 shows still another embodiment of the present invention. A space 11f is formed inside an anode assembly 11. A heater 21 of a heating device 20 is arranged in the space 11f through an insulator 115. Since the heater 21 is not exposed in the space where the gas to be ionized is supplied, the purity of the gas will not be decreased. In addition, the service life of the heater itself is prolonged.

FIG. 7 shows still another embodiment of the present invention. In this embodiment, a thermally conductive and electrically insulating support member 13 is fixed on the lower surface of the bottom of a coolant reservoir 14. An anode assembly 111 having a cylindrical shape as a whole and tapered downward or having a funnel shape is mounted on the support member 13. The anode assembly 111 is connected to an inlet pipe 33 and an evacuation pipe 81. The inlet pipe 33 receives a gas from a gas tank (not shown) and sprays the gas inside the anode assembly 111. The evacuation pipe 81 evacuates excessive gas. The gas supplied to the anode assembly 111 is condensed to collect as a condensed liquid 113 in a capillary portion or needle anode 111a. The needle anode 111a is made of a low reactivity metal, such as various metals (e.g., tungsten and tantalum) called refractory metals, in the same manner as in FIG. 5. Another needle anode 118 made of a refractory metal, such as tantalum or tungsten is inserted in the capillary portion 111a to further increase brightness of the ion source. In this embodiment, a heater 21 of the heating device 20 is wound around the anode assembly 111. Therefore, the entire wall for condensing the gas can be kept substantially at a predetermined temperature.

In this embodiment, a heater 27 is wound around an insulating pipe 32 disposed between the inlet pipe 33 and the supply pipe 31 and its vicinity, and a heater 28 is wound around an insulating pipe 82 disposed between the evacuation pipe 81 and a pipe 83 and its vicinity. As a result, the gas will not be liquefied and so degrade the insulating property of these insulating pipes. The gas inlet pipe 33 and an evacuation pipe 81 of the predetermined gas may extend through the support member 13 and hence the coolant may be supplied inside the anode assembly 111. In this case, in order to prevent the gas from overcooling, thermal insulation is preferably provided, or a heater is preferably inserted inside the anode assembly 111, as shown in FIG. 6.

The present invention has been exemplified by particular embodiments but is not limited thereto. Various changes and modifications may be made within the spirit and scope of the invention. For example, the coolant may be dry ice. Alternatively, a refrigerant may be used in place of the coolant. Instead of using the heater 21, the anode assembly or needle anode may be heated by electron bombardment. In addition, the present invention can be applied together with conventional techniques as needed.

In the embodiment shown in FIG. 2, the coolant reservoir 14 is isolated from the high positive potential by using the support member 13. However, if needed, the support member 13 may be removed, and the anode assembly and the coolant reservoir may be set at the high potential. If the ionization chamber 16 shown in FIG. 2 is made of an insulator, the insulators 32 and 82 can be removed.

In the above embodiment, the gas is supplied to the ionization chamber or gas chamber via the pipe. However, a liquefied gas may be externally directly supplied to the ionization chamber or gas chamber.

What is claimed is:

1. An ion beam generating apparatus comprising:
a vacuum chamber capable of being evacuated to a predetermined pressure;
an anode assembly disposed in said vacuum chamber, said anode assembly having an anode which has a needle like tip at one end thereof;
an extraction electrode disposed a predetermined distance from said needle-like tip;
gas supply means for supplying a predetermined gas to the vicinity of said anode assembly;
means for colling said anode assembly to a temperature sufficient for said predetermined gas to condense on said anode;
means for heating said cooled anode assembly to maintain said anode assembly at a temperature between the melting point and the boiling point of said predetermined gas; and
power source means for providing an electric potential between said anode and said extraction electrode to ionize said predetermined gas condensed on said anode.

2. An apparatus according to claim 1, wherein said anode assembly is a rod-shaped member.

3. An apparatus according to claim 1, wherein said anode assembly comprises a refractory metal.

4. An apparatus according to claim 1, wherein said means for cooling comprises a coolant reservoir for storing a coolant.

5. An apparatus according to claim 4, wherein said anode assembly is connected to said coolant reservoir through a thermally conductive and electrically insulating member.

6. An apparatus according to claim 4, further comprising heating means for forcibly evacuating the coolant from said coolant reservoir.

7. An apparatus according to claim 1, wherein said predetermined gas is a liquefied gas.

8. An apparatus according to claim 1, wherein said predetermined gas is supplied to a gas chamber surrounding said anode assembly.

9. An apparatus according to claim 8, wherein said anode assembly extends outward through a hole formed in said gas chamber.

10. An apparatus according to claim 8, wherein said gas chamber is connected to an evacuation pipe for evacuating excessive gas therefrom.

11. An apparatus according to claim 1, wherein said anode assembly comprises a pair of leads and said anode arranged therebetween.

12. An apparatus according to claim 11, wherein said means for heating is a heater arranged in the vicinity of said needle-like tip of said anode.

13. An apparatus according to claim 1, wherein said anode assembly comprises a cylindrical member having a capillary portion forming said needle-like tip, and said anode assembly is mounted to said means for cooling by a thermally conductive and electrically insulating member, said predetermined gas being supplied into a space within said cylindrical member.

14. An apparatus according to claim 13, wherein said cylindrical member has a condensation rod therein.

15. An apparatus according to claim 14, wherein said condensation rod has a heater.

16. An apparatus according to claim 13 having a needle anode disposed in said capillary portion.

17. An apparatus according to claim 13, wherein said means for heating has a heater wound around said cylindrical member.

18. An apparatus according to claim 1, wherein said heating means has a heater arranged inside said anode.

19. An apparatus according to claim 1, wherein said predetermined gas is supplied to gas chamber surrounding said anode assembly by a gas inlet pipe, said gas inlet pipe being fixed at one end to said gas chamber and being connected to a gas supply pipe at the other end through a first insulating member.

20. An apparatus according to claim 19, wherein said gas chamber is connected to an evacuation pipe for evacuating excessive gas from said gas chamber, said evacuation pipe being connected to a vacuum source through a second insulating member.

21. An apparatus according to claim 20, wherein said first and second insulating members are surrounded by heaters, respectively.

* * * * *

UNITED STATES PATENT AND TRADEMARK OFFICE
CERTIFICATE OF CORRECTION

PATENT NO. : 4,638,209

DATED : January 20, 1987

INVENTOR(S) : Asamaki et al

It is certified that error appears in the above-identified patent and that said Letters Patent is hereby corrected as shown below:

Column 3, line 9, delete "comprises".

Column 3, line 41, delete "plate".

Column 4, line 27, delete "includes" and insert ---- include ----.

Column 6, line 61, delete "comprise".

Column 8, line 22, delete "colling" and insert ---- cooling ----.

Column 10, line 2, after "to" insert ---- a ----.

In the Abstract

Line 4, delete "5".

Signed and Sealed this

Fifteenth Day of September, 1987

Attest:

DONALD J. QUIGG

*Attesting Officer*  *Commissioner of Patents and Trademarks*